United States Patent [19]
Sali et al.

[11] Patent Number: 5,659,502
[45] Date of Patent: Aug. 19, 1997

[54] NEGATIVE WORD LINE VOLTAGE REGULATION CIRCUIT FOR ELECTRICALLY ERASABLE SEMICONDUCTOR MEMORY DEVICES

[75] Inventors: Mauro Sali, S. Angelo Lodigiano; Corrado Villa, Sovico; Marcello Carrera, Trescore Balneario, all of Italy

[73] Assignee: SGS-Thomson Microelectronics S.r.l., Agrate Brianza, Italy

[21] Appl. No.: 665,862

[22] Filed: Jun. 19, 1996

[30] Foreign Application Priority Data

Jun. 19, 1995 [EP] European Pat. Off. .............. 95830253

[51] Int. Cl.$^6$ ................................................. G11C 13/00
[52] U.S. Cl. ......................... 365/185.18; 365/185.23; 365/185.29; 365/189.09; 365/226
[58] Field of Search ........................ 365/185.18, 185.21, 365/185.23, 185.29, 226, 189.09, 210

[56] References Cited

U.S. PATENT DOCUMENTS

| | | | |
|---|---|---|---|
| 5,077,691 | 12/1991 | Haddad et al. | 365/218 |
| 5,282,170 | 1/1994 | Van Buskirk et al. | 365/226 |
| 5,392,253 | 2/1995 | Atsumi et al. | 365/185.23 |
| 5,446,697 | 8/1995 | Yoo et al. | 365/189.09 |
| 5,499,212 | 3/1996 | Amanai | 365/185.23 |

FOREIGN PATENT DOCUMENTS 0 640 985  3/1995  European Pat. Off. .

*Primary Examiner*—Son T. Dinh
*Attorney, Agent, or Firm*—David V. Carlson; Seed and Berry LLP

[57] ABSTRACT

A negative word line voltage regulation circuit integratable in an electrically erasable semiconductor memory device. The circuit regulates a negative word line voltage to be supplied to word lines of the memory device during an electrical erasure of the memory device. The circuit includes an operational amplifier with a first input coupled to a reference voltage, a second input coupled to the negative word line voltage, and an output controlling a voltage regulation branch connected between an external power supply and the negative word line voltage, to provide a regulation current for regulating the negative word line voltage. The output of the operational amplifier also controls a voltage sensing branch, connected between the external power supply and the negative word line voltage, to provide a sensing signal coupled to the second input of the operational amplifier.

20 Claims, 2 Drawing Sheets

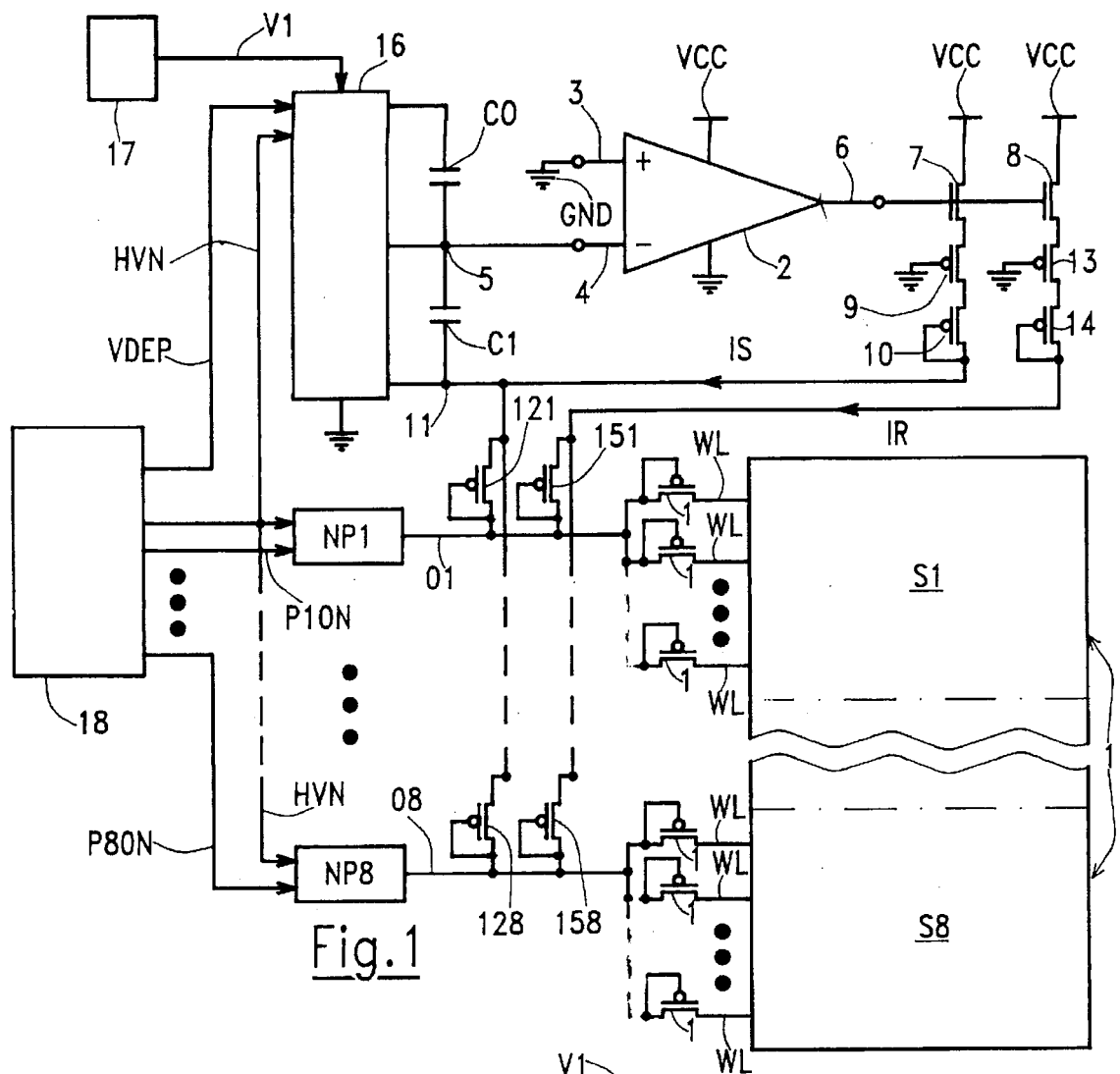
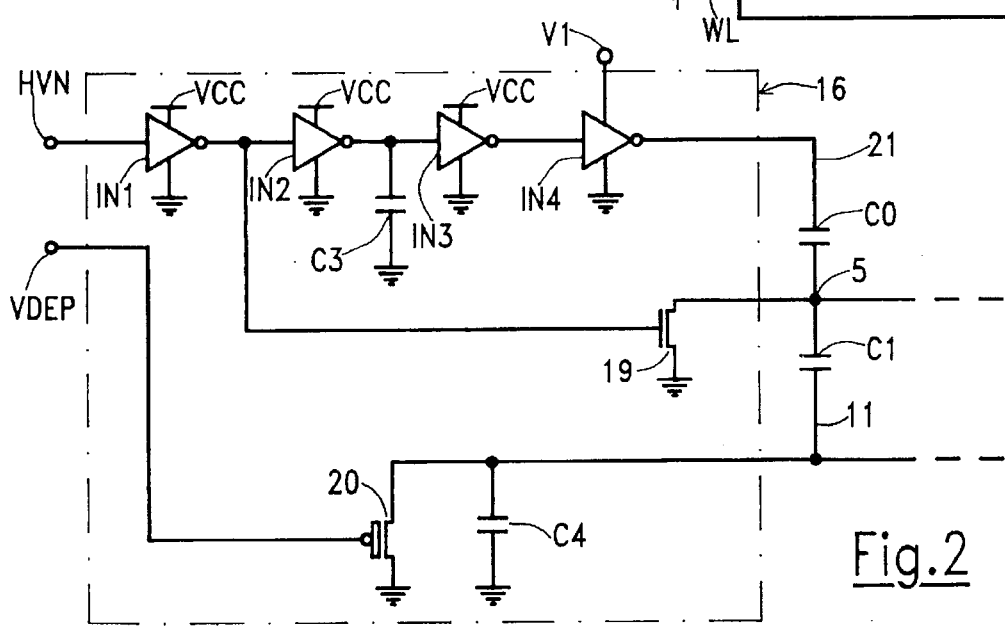

NEGATIVE WORD LINE VOLTAGE REGULATION CIRCUIT FOR ELECTRICALLY ERASABLE SEMICONDUCTOR MEMORY DEVICES

TECHNICAL FIELD

The present invention relates to a negative word line voltage regulation circuit for electrically erasable semiconductor memory devices, particularly for Flash EEPROMs.

Background of the Invention

Flash Electrically Erasable and Programmable ROMs (shortly, Flash EEPROMs) have memory cells which are formed by floating-gate MOSFETs. A Flash EEPROM memory cell is written by means of hot-electron injection into the floating gate, and is erased by means of Fowler-Nordheim tunneling of electrons through the oxide layer interposed between the floating gate and the semiconductor substrate.

To activate the tunnel effect, a sufficiently high electric field must be present in the oxide layer. This is normally achieved by applying a suitable electric potential difference between the source electrode and the control gate electrode of the memory cell, while the drain electrode is normally left floating.

According to a known technique, such a potential difference is developed by biasing the source electrode of the floating-gate MOSFET with a high positive voltage of the order of 12 V, and keeping the control gate electrode grounded.

In Dual Power Supply (DPS) memories the 12 V voltage is supplied by an external power supply, provided in addition to the 5 V (or 3 V) power supply. As an alternative, the 12 V voltage could be generated directly on-chip by suitable charge pumps which, starting from the available 5 V voltage, boost it to the required high voltage. Memory devices of this kind are called Single Power Supply (SPS), since they only require one external power supply (namely, the 5 V one).

The above-mentioned technique for erasing memory cells has however a number of drawbacks, mainly related to the high reverse bias condition of the PN junction formed by the source electrode and the substrate (normally at the ground potential). One significant drawback occurs when a memory cell is biased to be erased, a current of the order of 10 nA starts flowing due to band-to-band tunneling. Since in Flash EEPROMs several memory cells (sometimes all of them) can be erased simultaneously, the individual currents sum up to values of some tens of milliamperes in memories with size of the order of some megabits.

If on the one hand this is not a major problem in DPS memories, wherein the 12 V external power supply is able to provide the required current, on the other hand the high current consumption during erasure makes it impossible to use on-chip charge pumps to generate the 12 V voltage.

In the U.S. Pat. No. 5,077,691 a Flash EEPROM array with negative gate voltage erase operation is proposed which provides for erasing a Flash EEPROM memory cell by applying a relatively high negative voltage (−12 V to −17 V) to the control gate electrode of the cell, and a low positive voltage (+0.5 V to +5 V) to the source electrode.

In this way, the source electrode bias voltage can be derived from the 5 V external supply, and the negative voltage for the control gate can be generated directly on-chip by means of charge pumps.

When such a solution is adopted, it is however necessary to provide a suitable regulation for the on-chip generated negative voltage.

The U.S. Pat. No. 5,282,170 describes a negative power supply circuit for a SPS Flash EEPROM implementing said negative gate voltage erase operation. The negative power supply circuit comprises charge pumps for generating a high negative voltage to be supplied to word lines of the memory array during flash erasure of the memory cells, and a regulation circuit for regulating the negative voltage generated by the charge pumps, so that it is independent of the external 5 V supply.

The regulation circuit comprises a comparator with the inverting input supplied with a reference voltage derived by resistive partition from the external supply. The non-inverting input is connected to the central node of a capacitive divider connected between ground and a sensing node in turn coupled to the negative voltage to be regulated (i.e., to the outputs of the charge pumps) via a pair of diode-connected P-channel MOSFETs. The output of the comparator controls the gate electrode of a pull-up P-channel MOSFET connected to the external supply and coupled to the sensing node via a further diode-connected P-channel MOSFET. During an initialization phase, the two capacitors of the capacitive divider are charged up to a voltage of about 2 V, and the sensing node is grounded. After the initialization phase, the comparator compares the voltage at the central point of the capacitive divider with said reference voltage and, if the former is lower than the latter, turns the pull-up MOSFET on: in this way, the load current of the charge pumps is increased, and the voltage on the word lines decreases in absolute value.

A problem of the regulation circuit described above resides in that the potential on the sensing node is affected by the voltage drop across said pair of diode-connected P-channel MOSFETs, due to the current flowing through them during the regulation of the negative voltage. This means that the voltage compared by the comparator with the reference voltage does not exactly correspond to the voltage to be regulated.

SUMMARY OF THE INVENTION

In view of the state of the art described, it is a first object of the present invention to provide a circuit for regulating the negative voltage supplied to the word lines of a Flash EEPROM during erasure, which overcomes the first above-mentioned problem of the known regulation circuit.

According to the present invention, said object is attained by means of a negative word line voltage regulation circuit integratable in an electrically erasable semiconductor memory device. This circuit regulates a negative word line voltage to be supplied to word lines of the memory device during an electrical erasure of the memory device. The circuit includes an operational amplifier with a first input coupled to a reference voltage, a second input coupled to the negative word line voltage and an output controlling a voltage regulation branch, connected between an external power supply and said negative word line voltage. The voltage regulation branch provides a regulation current for regulating said negative word line voltage. The output of the operational amplifier also controls a voltage sensing branch, connected between said external power supply and said negative word line voltage, to provide a sensing signal coupled to said second input of the operational amplifier.

In the regulation circuit of the present invention, the operational amplifier controls two distinct branches. The first distinct branch provides the regulation current necessary for regulating the word line negative voltage. The second distinct branch provides a sensing signal which is fed back to the input of the operational amplifier. The sensing signal provided by the second branch and fed back to the input of the operational amplifier is not affected by voltage drops due to the regulation current flowing in the first branch.

These and other features and advantages of the present invention will be made more evidence by the following detailed description of a particular embodiment, described as a non-limiting example in the annexed drawings.

BRIEF DESCRIPTION OF THE DRAWINGS

FIG. 1 is a schematic circuit diagram of a negative word line voltage regulation circuit according to the present invention.

FIG. 2 is a detailed circuit diagram of a circuit of the circuit of FIG. 1.

DETAILED DESCRIPTION OF THE INVENTION

Figure 3:
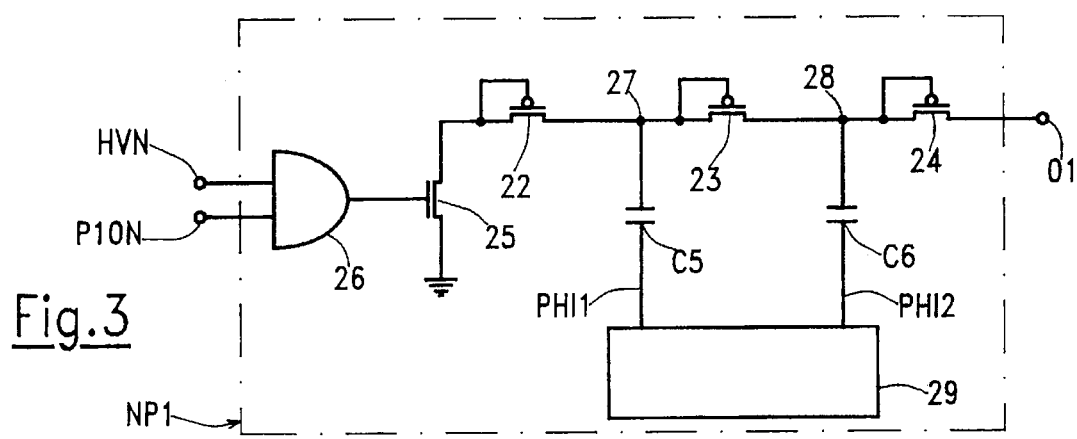
FIG. 3 is a detailed circuit diagram of a circuit of the circuit of FIG. 1.

In FIG. 1 the reference numeral 1 is used to indicate a matrix 1 of memory cells of an electrically erasable semiconductor memory device, for example a Flash EEPROM. Applicants incorporates by reference European Patent Application No. 95830348.9 filed Jul. 31, 1995, European Patent Application No. 95830317.4 filed Jul. 24, 1995, and European Patent Application No. 95830351.3 filed Aug. 2, 1995 which disclose other embodiments of memory devices similar to the applicant's invention described below and list the applicant as an inventor. As known, the memory cells in the matrix 1 are arranged in rows (word lines) and columns (bit lines). Each memory cell, represented by a floating-gate MOS transistor, has a control gate electrode connected to one respective word line. In FIG. 1, the word lines are indicated with the reference numeral WL.

The word lines WL are grouped together to form sectors S1–S8 of the memory matrix 1. All the word lines WL of a given sector S1–S8 are commonly coupled, via respective diode-connected P-channel MOSFETs 1, to a negative voltage output O1–O8 of a negative charge pump NP1–NP8 associated to said sector S1–S8.

A negative word line voltage regulation circuit according to the present invention comprises an operational amplifier 2 having a non-inverting input 3 connected to ground (GND) and an inverting input 4 connected to a central node 5 of a capacitive divider having a first capacitor C0 and a second capacitor C1. Preferably, capacitors C0 and C1 have plates respectively formed by the two polysilicon layers which also form the floating gates and the control gates of the memory cells. The dielectric of the capacitors being formed by the oxide layer which isolates the control gates from the floating gates. In this way, the capacitive values of capacitors C0, C1 do not depend on the voltage applied across them.

An output 6 of the operational amplifier 2 drives a gate electrode of two N-channel MOSFETs 7 and 8 with drains connected to an external voltage supply VCC (typically the 5 V supply). The N-channel MOSFET 8 has a source electrode connected to a P-channel MOSFET 13 with gate tied to ground and drain connected to a diode-connected P-channel MOSFET 14. The drain electrode of MOSFET 14 is coupled to each one of the negative voltage outputs O1–O8 through respective diode-connected P-channel MOSFETs 151–158. The N-channel MOSFET 7 has a source electrode connected to a P-channel MOSFET 9 with gate tied to ground and drain connected to a diode-connected P-channel MOSFET 10. The drain electrode of MOSFET 10 is coupled to each one of the negative voltage outputs O1–O8 through respective diode-connected P-channel MOSFETs 121–128. The drain electrode of MOSFET 10, being further connected to a node 11 to which a second plate of capacitor C1 is also connected, is coupled to the inverting input 5 of the operational amplifier 2.

The MOSFETs 8, 13 and 14, together with the MOSFETs 151–158, form a plurality of voltage regulation branches, one for each of the negative voltage outputs O1–O8 of the negative charge pumps NP1–NP8. The MOSFETs 7, 9 and 10, together with the MOSFETs 121–128, form a plurality of voltage sensing branches, one for each of the negative voltage outputs O1–O8 of the pumps NP1–NP8. The MOSFETs 8, 13 and 14 have bigger dimensions than the MOSFETs 7, 9 and 10, so that the current IS flowing through the voltage sensing branches is always negligible with respect to the regulation current IR flowing through the voltage regulation branches.

The regulation circuit also comprises a circuit 16 for biasing the capacitors C0, C1 of the capacitive divider, shown in detail in FIG. 2. This circuit comprises a chain of four inverters IN1–IN4. The first three inverters IN1–IN3 are supplied with the external voltage supply VCC, while the fourth inverter IN4 is supplied with a fixed voltage V1, which is for example generated by a band-gap reference voltage generator schematically indicated with 17 in FIG. 1. The first inverter IN1 receives a signal HVN which is activated by an internal control circuit 18 of the memory device when an electrical erasure must be performed. Band-gap reference voltage generator 17 and internal control circuit 18 are both types of circuits that are well known in the art and are used in prior art EEPROMS. The internal details of these circuits do not constitute the invention and any suitable such circuits are acceptable. A person of skill in the art would be able to use such known circuits to provide the requested signals based on the disclosure of the present invention. The output of the first inverter IN1, in addition of supplying the input of the second inverter IN2, controls a gate electrode of an N-channel MOSFET 19 connected between the central node 5 of the capacitive divider and ground. A capacitor C3 is connected between the output of the second inverter IN2 and ground to provide a delay between the transition of the output of IN1 and the transition of the input of IN4. An output of the fourth inverter IN4 is connected to a node 21 to which a second plate of capacitor C0 is also connected. The node 11 of capacitor C1 is connected to ground through a P-channel depletion MOSFET 20, whose gate electrode is controlled by a signal VDEP generated by the internal control circuit 18. A damping capacitor C4 is connected between the second plate 11 of capacitor C1 and ground, to prevent the voltage on the second plate 11 of C1 from oscillating.

FIG. 3 is a detailed circuit diagram of one of the negative charge pump blocks of FIG. 1, for example NP1. The circuit comprises, in a per-se known way, a chain of diode-connected P-channel MOSFETs 22, 23 and 24. The first P-channel MOSFET of the chain, 22, has a drain electrode connected to ground through an N-channel MOSFET 25 whose gate electrode is controlled by an output of an AND gate 26 with a first input supplied with the signal HVN, and a second input supplied with a signal P1ON. The signal HVN commonly supplies all the negative charge pumps NP1–NP8. The signal P1ON is generated by the internal control circuit 18 and is one of a plurality (eight in this example) of signals P1ON–P8ON, each supplying a respective one of the negative charge pumps NP1–NP8 to selectively activate the respective negative charge pump NP1–NP8 when the respective sector S1–S8 must be erased. To turn a given negative charge pump on, both HVN and the respective selection signal P1ON–P8ON must be logic "1." A first capacitor C5 has one plate connected to the common node 27 of MOSFETs 22 and 23, and the other plate supplied with a first clock signal PHI1. A second capacitor C6 has one plate connected to the common node 28 between MOSFETs 23 and 24, and the other plate supplied with a second clock signal PHI2. The two clock signals PHI1 and PHI2 are generated by a clock generator 29. The electrical configuration of the clock generator 29 is well known to the skilled artisan. The source electrode of MOSFET 24 forms the output O1 of the negative charge pump NP1.

Figure 4:
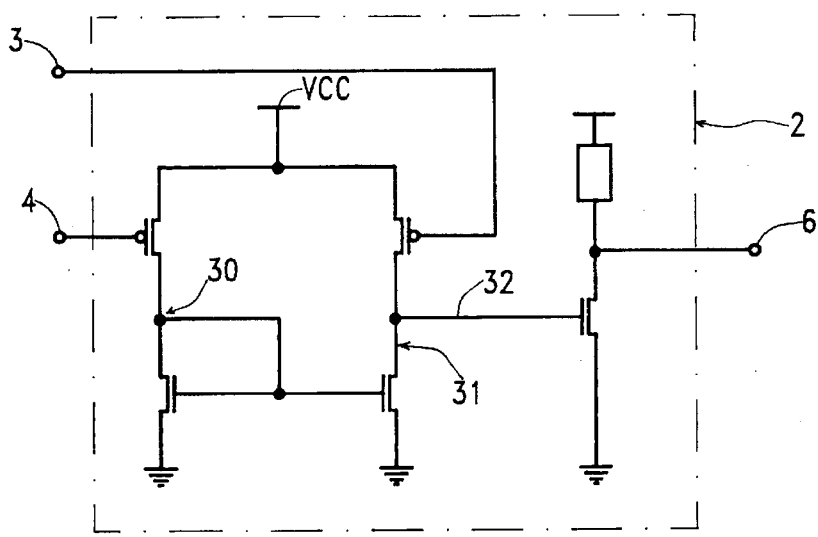
FIG. 4 is a detailed circuit diagram of a circuit of the circuit of FIG. 1.

The detailed circuit structure of the operational amplifier 2 is shown in FIG. 4. As visible, the operational amplifier 2 substantially comprises in a per-se known way two stages, a first stage composed by two branches 30, 31 connected in a current mirror configuration and a second stage inverting the output of the first stage. The inputs of the operational amplifier 2 are P-channel MOSFETs, due to the choiche of using ground as the reference voltage for the amplifier.

The working of the negative word line voltage regulation circuit described above will be described hereinafter.

Figure 5A:
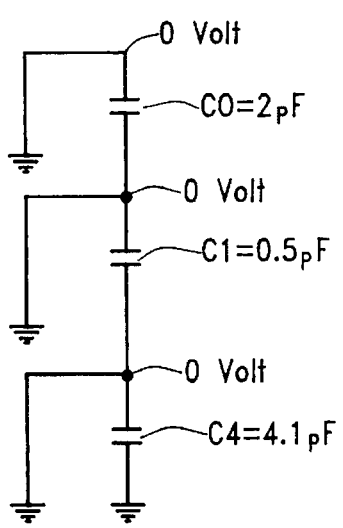
FIGS. 5A to 5C are electrical equivalent circuit diagrams of the first circuit block, in three different operating conditions.

When the memory device is not in the electrical erase mode, the signal HVN is a logic "0." In this condition, all the negative charge pumps NP1–NP8 are off, the output of the first inverter IN1 is a logic "1" and MOSFET 19 is on, so that the central node 5 of the capacitive divider is tied to ground. Also, the input of the fourth inverter IN4 is a logic "1," so that the second plate 21 of capacitor C0 is tied to ground. Furthermore, as long as HVN is a logic "0," the signal VDEP is approximately equal to −4 V, and the depletion MOSFET 20 is on, so that the second plate 11 of capacitor C1 is also tied to ground. This means that before an electrical erasure starts, the capacitors C0 and C1 of the capacitive divider are not charged. This situation is depicted in FIG. 5A.

When the memory cells of one or more of the sectors S0–S8 must be erased, the control circuit activates the signal HVN, as well as one or more of the signals P1ON–P8ON; the negative charge pumps associated to the sectors to be erased are thus turned on, and the voltage on their respective output nodes becomes progressively more negative. However, due to the rather high capacitive load seen by the negative charge pumps, the voltage on their output nodes changes rather slowly.

Figure 5B:
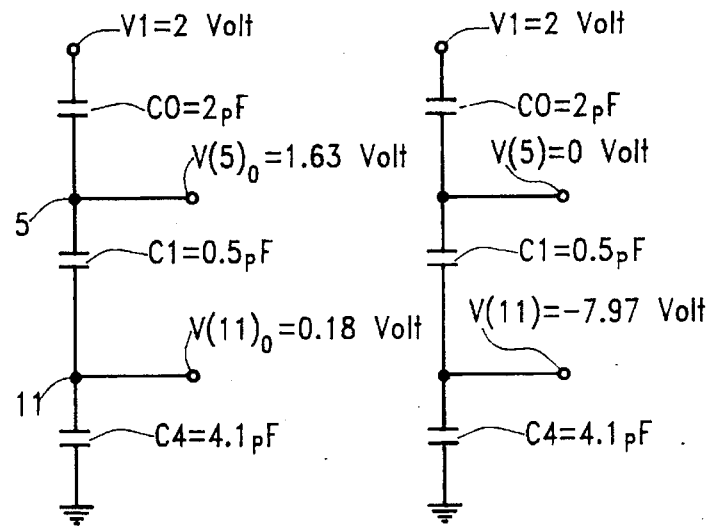
Figure 5C:
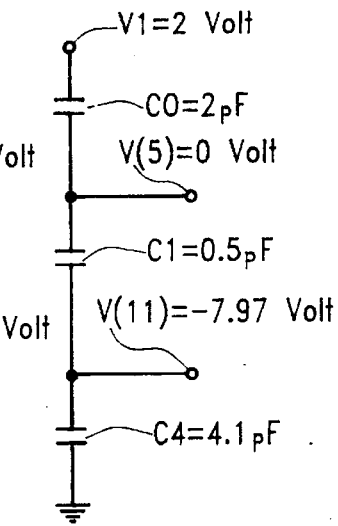

In FIG. 5B the situation at the beginning of the erase operation is depicted. Simultaneously with the activation of HVN, VDEP takes an approximate value of 4 V, so that the depletion MOSFET 20 turns off. Also, the output of the first inverter IN1 goes to a logic "0," and MOSFET 19 turns off, thus leaving the node 5 floating; after a predetermined delay, fixed by capacitor C3, the input of inverter IN4 also goes to a logic "0," so that the second plate 21 of capacitor C0 is tied to the fixed reference voltage V1. The initial voltage V(5) on node 5 is given by:

$$V(5)_0 = V1 * C0/(C0+C')$$

where $C'=(C1+C4)/(C1*C4)$, and the initial voltage on the second plate 11 of C1 is given by:

$$V(11)_0 V1 * C''/(C4+C'')$$

where $C''=(C0+C1)/(C0*C1)$. These are the voltage values on nodes 5 and 11 before the regulation circuit has stabilized.

The value of the regulated negative voltage outputs after the regulation circuit has stabilized can be found noting that the voltage V(5) on node 5 is kept to ground (node 5 is a virtual ground). The voltage variation on node 11 necessary to bring V(5) to ground is:

$$\Delta V(11) = -V(5)_0 * (C0+C1)/C1$$

so that during regulation the voltage on node 11 is:

$$V(11) = V(11)_0 + \Delta V(11)$$

It is to be noted that the value of the voltage on node 11 during regulation is a function of V1, C0, C1 and C4, but not of the external power supply VCC. If V1 is chosen to be 2 V, C0 2 pF, C1 0.5 pF and C4 4 pF, the following voltage values are obtained:

$$V(5)_0 = 1.63\ V$$

$$V(11)_0 = 0.18\ V$$

$$\Delta V(11) = -8.15\ V$$

$$V(11) = -7.97\ V$$

The regulation circuit keeps the negative voltage outputs of the negative charge pumps at a voltage value equal to V(11)+VTH, where VTH is the (negative) threshold voltage of the diode-connected P-channel MOSFETs 121–128. The regulated negative voltage: V(WL) on the word lines WL is equal to:

$$V(WL) = V(11) + VTH - VTH = V(11) = -7.97\ V$$

which is a suitable value to perform the electrical erasure of the memory cells.

The regulation circuit of the present invention is designed to work in a linear way, differently from the regulation circuit according to the prior art which works in an "on-off" way.

If the negative voltage outputs of the negative charge pumps become too negative, a regulation current IR flows through the voltage regulation branch to increase the load current of the negative charge pumps, so that the negative voltage outputs become less negative. The sensing current IS flowing in the voltage sensing branch is always negligible with respect to the regulation current IR:IS must only keep the diode-connected MOSFETs 10 and 121–128 biased.

It is important to note that a significant problem of the regulation circuit according to the prior art is the progressive loss of charge of the capacitors of the capacitive divider due to leakage currents. This effect, related to the fact that the voltage on the central node of the capacitive divider is 2 V, introduces drifts in the voltage compared by the comparator with the reference voltage, and as a consequence also the regulated voltage drifts. In the regulation circuit of the present invention, thanks to the fact that the reference voltage for the operational amplifier is chosen to be the ground voltage, during regulation the central node 5 of the capacitive divider is kept to ground, and the effect of leakage currents on the charge of capacitors C0 and C1 is minimized.

We claim:

1. A negative word line voltage regulation circuit integratable in an electrically erasable semiconductor memory device for regulating a negative word line voltage to be supplied to word lines of the memory device during an electrical erasure of the memory device, comprising:

an operational amplifier with a first input coupled to a reference voltage;

a second input coupled to said negative word line voltage; and an output controlling a voltage regulation branch, connected between an external power supply and said negative word line voltage, to provide a regulation current for regulating said negative word line voltage, wherein said output of the operational amplifier also controls a voltage sensing branch, connected between said external power supply and said negative word line voltage, to provide a sensing signal coupled to said second input of the operational amplifier, and said regulation current flowing in the voltage regulation branch is substantially higher than a sensing current flowing through the voltage sensing branch.

2. The negative word line voltage regulation circuit according to claim 1 wherein said first input of the operational amplifier is a non-inverting input, and in that said reference voltage is a ground voltage.

3. The negative word line voltage regulation circuit according to claim 2 wherein said first and second inputs of the operational amplifier are two gate electrodes of two respective P-channel MOSFETs.

4. The negative word line voltage regulation circuit according to claim 3 wherein said sensing signal is coupled to said second input of the operational amplifier through a capacitive divider such that a first capacitor and a second capacitor having respective first plates connected to a common node which is connected to said second input of the operational amplifier.

5. The negative word line voltage regulation circuit according to claim 4 wherein said sensing signal is connected to a second plate of said second capacitor of the capacitive divider.

6. The negative word line voltage regulation circuit according to claim 5, further including a circuit for biasing said capacitive divider, said biasing circuit comprising:

first bias means, responsive to an enable signal activated when an electrical erasure must be performed, to selectively connect a second plate of the first capacitor to the ground or to a fixed voltage respectively when said enable signal is activated or de-activated;

second bias means, also responsive to said enable signal, for selectively connecting the common plate of the first and second capacitors to the ground or leaving said common plate floating respectively when said enable signal is de-activated or activated; and third bias means for connecting the second plate of the second capacitor to the ground when the enable signal is de-activated.

7. The negative word line voltage regulation circuit according to claim 6 wherein said first bias means is an inverter supplied with said fixed voltage, said second bias means is an N-channel MOSFET, and said third bias means is a P-channel MOSFET of the depletion type.

8. The negative word line voltage regulation circuit according to claim 6 wherein said fixed voltage and said first and second capacitors have respective values suitable to provide a negative word line voltage of approximately −8 V.

9. The negative word line voltage regulation circuit according to claim 4 wherein said first and second capacitors have plates respectively formed by a first and a second polysilicon layers also forming floating gates and control gates of the memory cells, respectively, and a dielectric formed by an oxide layer also insulating the control gates of the memory cells from the floating gates.

10. A negative word line voltage regulation circuit integratable in an electrically erasable semiconductor memory device for regulating a negative word line voltage to be supplied to word lines of the memory device during an electrical erasure of the memory device, comprising:

an operational amplifier with a first input coupled to a reference voltage;

a second input coupled to said negative word line voltage; and an output controlling a voltage regulation branch, connected between an external power supply and said negative word line voltage, to provide a regulation current for regulating said negative word line voltage, wherein said output of the operational amplifier also controls a voltage sensing branch, connected between said external power supply and said negative word line voltage, to provide a sensing signal coupled to said second input of the operational amplifier, and said negative word line voltage is generated by at least one negative charge pump integrated in the memory device.

11. A voltage regulation circuit integrated in a memory device having a memory sector and operable during erasure of said memory sector, said regulation circuit comprising:

a word line of said memory device;

a negative voltage supply coupled to said word line;

a comparator having first and second circuit stages coupled between a first input, a second input and a first controlling output, said first circuit stage having two branches connected in a current mirror configuration and said second circuit stage inverting the output of the first stage, said first input being coupled to a reference voltage, said second input being coupled to said word line, and said first and second inputs of said comparator being coupled to P-MOS transistor;

a voltage regulation branch coupled between an external power supply and said word line and coupled to said first controlling output; and a voltage sensing branch coupled between said external power supply and said word line and coupled to said first controlling output and said second input, wherein said regulation branch provides a regulation current signal for regulating said negative voltage supply, and said sensing branch provides a sensing current signal to said second input of said comparator.

12. The voltage regulation circuit of claim 11 wherein said sensing current signal within said sensing branch is always negligible with respect to said regulation current within said regulation branch.

13. A voltage regulation circuit integrated in a memory device having a memory sector and operable during erasure of said memory sector, said regulation circuit comprising:

a word line of said memory device;

a negative voltage supply coupled to said word line;

a comparator having a first input, a second input and a first controlling output, said first input is coupled to a reference voltage and said second input is coupled to said word line;

a voltage regulation branch coupled between an external power supply and said word line and coupled to said first controlling output;

a voltage sensing branch coupled between said external power supply and said word line and coupled to said first controlling output and said second input, wherein said regulation branch provides a regulation current signal for regulating said negative voltage supply, and said sensing branch provides a sensing current signal to said second input of said comparator; and a voltage divider having serially coupled capacitive elements defining first and second distal nodes and an intermediate node, said intermediate node being coupled to said second input and said second distal node being coupled to said sensing branch.

14. The voltage regulation circuit of claim 13, further including a biasing circuit responsive to an enable signal activated when an electrical erasure must be performed.

15. The voltage regulation circuit of claim 14 wherein the biasing circuit further includes a first bias means for selectively coupling said first distal node to a ground terminal or to a fixed voltage supply, a second bias means for selectively coupling said intermediate node to the ground terminal or leaving said intermediate node floating, and a third bias means for coupling said second distal node to the ground terminal or said sensing branch.

16. The voltage regulation circuit of claim 15 wherein said first bias means is an inverter supplied with said fixed voltage supply, said second bias means is an N-MOS transistor, and said third bias means is a P-MOS transistor of the depletion type.

17. The voltage regulation circuit of claim 13 wherein said capacitive elements further include first and second polysilicon layers providing floating gates and control gates of the memory cells, respectively, and an oxide layer providing a dielectric layer insulating the control gates of the memory cells from the floating gates.

18. The voltage regulation circuit of claim 14 wherein said biasing circuit further includes:

first and second bias inputs coupled to a control circuit for determining the programmable or erasure state of said memory device;

first, second and third outputs; said first output being coupled to said first distal node, said second output being coupled to said intermediate node, and said third output being coupled to said second distal node;

a last inverter coupled to said first output and coupled between a fixed voltage supply and a ground terminal;

a first inverter being coupled to said first bias input and having an output, said first inverter being coupled between a reference voltage generator and ground terminal;

a serially coupled second and third inverter, said second inverter being coupled to said first inverter output and said third inverter having an output coupled to said last inverter, said second and third inverters being coupled between said reference voltage generator and the ground terminal;

a P-MOS depletion transistor having a gate electrode coupled to said second bias input and source and drain terminals coupled between said third output and the ground terminal; and an N-MOS transistor having a gate electrode coupled to said output of said first inverter and source and drain terminals coupled between said intermediate node and the ground terminal.

19. A voltage regulation circuit integrated in a memory device having a memory sector and operable during erasure of said memory sector, said regulation circuit comprising:

a word line of said memory device;

at least one negative charge pump voltage supply coupled to said word line;

a comparator having a first input, a second input and a first controlling output, said first input is coupled to a reference voltage and said second input is coupled to said word line;

a voltage regulation branch coupled between an external power supply and said word line and coupled to said first controlling output; and a voltage sensing branch coupled between said external power supply and said word line and coupled to said first controlling output and said second input, wherein said regulation branch provides a regulation current signal for regulating said negative voltage supply, and said sensing branch provides a sensing current signal to said second input of said comparator.

20. A voltage regulation circuit integrated in a memory device operable during erasure, said regulation circuit comprising:

a memory sector within said memory device;

a negative voltage supply;

a word line coupled between said voltage supply and said memory sector for carrying a respective signal;

a sensing branch coupled to said word line for sensing the negative word line signal;

a supplementing branch coupled to said word line for regulating said word line signal at a constant value; and a control circuit coupled between said sensing branch and said supplementing branch and having a reference potential; an operational amplifier having a first input, a second input and a first controlling output, said first input is coupled to a reference voltage, said second input is coupled to said word line, and said controlling output is coupled to said supplementing branch; and a voltage divider having first and second distal nodes and an intermediate node, said intermediate node is coupled to said second input and said second distal node is coupled to said sensing branch, wherein said sensing branch provides a sensing current signal to said control circuit, said control circuit compares the signal of said sensing branch with said reference potential, and said supplementing branch provides a supplemental signal to said word line signal for regulating said negative voltage supply in said word line.

* * * * *